(12) United States Patent
Torlotin

(10) Patent No.: US 6,341,069 B1
(45) Date of Patent: *Jan. 22, 2002

(54) RADIO MODEM FITTED WITH A MEMORY CARD READER

(75) Inventor: Thierry Torlotin, Boulogne (FR)

(73) Assignee: Alcatel, Paris (FR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/962,615

(22) Filed: Nov. 3, 1997

(30) Foreign Application Priority Data

Nov. 4, 1996 (FR) .............................. 96 13397

(51) Int. Cl.⁷ ................................ H05K 1/14
(52) U.S. Cl. ................ 361/737; 361/736; 361/725; 257/679; 235/492; 439/946
(58) Field of Search ................ 361/737, 736; 235/492; 257/679; 439/946, 638, 945, 928

(56) References Cited

U.S. PATENT DOCUMENTS

| | | | | |
|---|---|---|---|---|
| 5,608,607 A | * | 3/1997 | Dittmer | 361/686 |
| 5,625,534 A | * | 4/1997 | Okaya et al. | 361/686 |
| 5,673,180 A | * | 9/1997 | Pernet | 361/756 |
| 5,847,932 A | * | 12/1998 | Kantner | 361/737 |
| 5,982,624 A | * | 11/1999 | Omoda et al. | 361/737 |
| 5,984,731 A | * | 11/1999 | Laity | 439/676 |

FOREIGN PATENT DOCUMENTS

| | | |
|---|---|---|
| DE | 29505678 U | 7/1995 |
| EP | 0610025 A1 | 8/1994 |
| EP | 0657834 A1 | 6/1995 |
| WO | WO9626479 | 8/1996 |

* cited by examiner

Primary Examiner—Jeffrey A. Gaffin
Assistant Examiner—Tuan Dinh
(74) Attorney, Agent, or Firm—Sughrue Mion, PLLC

(57) ABSTRACT

A radio modem for fitting to equipment such as a portable computer, in particular, the modem being deigned to be inserted in a slot provided in the equipment, and the modem including two elements which are disposed relative to each other and which are fitted so as to form a memory card reader, and wherein, for the slot having dimensions adapted for receiving a modem in the form of an "equipment" card of determined thickness, each of the two elements is implemented by means of an equipment card of thickness that is smaller than the determined thickness.

6 Claims, 2 Drawing Sheets

RADIO MODEM FITTED WITH A MEMORY CARD READER

BACKGROUND OF THE INVENTION

A radio modem is a device enabling data coming from equipment such as a personal computer (PC) to be transmitted by radio.

An example of an application for the present invention consists in using a mobile radio communications system such as the GSM system in particular ("Global System for Mobile communications") to transmit data from equipment such as a portable computer, in particular.

In a system such as the GSM system, for example, it is known to provide mobile terminals with memory card readers, also known in the GSM system as SIM cards (for "Subscriber Identity Module"), thus making it possible to identify the users of such mobile terminals in order to control their access to the services provided by the system.

In the present specification, the term "memory card reader" is used to mean a device that performs both the mechanical and the electrical functions that are necessary for holding the card and for reading the information stored in the card.

It is thus known for GSM portable telephones to be fitted with SIM card readers.

Nevertheless, it is not presently known to provide a GSM radio modem for fitting to equipment such as a portable computer, in particular, with an SIM card reader. Such GSM radio modems are themselves generally made in the form of a card that is designed to be inserted in a slot provided in the equipment (with such a card being referred to herein as an "equipment" card in order to distinguish it from the "memory" card which is of considerably smaller thickness), and in addition it is not obvious how to provide a memory card reader in such an equipment card.

By way of example of an equipment card, mention is made of PCMCIA type cards (for "Personal Computer Memory Card International Association"), of length and width similar to those of a credit card type memory card, and of thickness that may either be 5 mm or 10.5 mm, depending on whether the card is a so-called PCMCIA type II card or a PCMCIA type III card.

Thus, it is known to make a radio modem in the form of a type III PCMCIA card, and to provide in the equipment which is to receive the modem a slot having dimensions and in particular thickness adapted to receiving that type of card.

Also, when the components corresponding to the radio portion proper of the modem function (as opposed to its portions for frequency conversion and for baseband processing) are too bulky to be capable of being housed in the modem card, it is known to house them in a separate module that is in the form of a projection from the card that sticks out from the slot when the modem card is in its inserted position.

SUMMARY OF THE INVENTION

A particular object of the present invention is to provide a radio modem implemented using the concept of an equipment card, and in particular a card of the PCMCIA type, that is capable of being provided with a reader for a memory card, such as an SIM card, in particular.

The present invention thus provides a radio modem for fitting to equipment such as a portable computer, in particular, the modem being deigned to be inserted in a slot provided in the equipment, and the modem essentially comprising two elements which are disposed relative to each other and which are fitted so as to form a memory card reader, and wherein, for the slot having dimensions adapted for receiving a modem in the form of an "equipment" card of determined thickness, each of the two elements is implemented by means of an equipment card of thickness that is smaller than the determined thickness.

According to another characteristic, the determined thickness is the thickness of an "equipment" card of PCMCIA type III, and each of the elements is implemented by means of an "equipment" card of PCMCIA type II.

Thus, the present invention enables better use to be made of existing card and slot formats by providing the additional function of a memory card reader, while nevertheless still retaining existing formats.

According to another embodiment of the present invention, only one of the PCMCIA type II cards is connected to the equipment, and any connection required between the two cards for the purpose of performing the modem function takes place via another element referred to as a connector module.

The advantage of the invention is thus further increased because it is not necessary to modify the connection means that need to be provided on the equipment in order to enable it to be fitted with a modem of the invention, as compared with the situation of a prior art modem implemented by means of a type III PCMCIA card (it being understood that the connector means provided on a PCMCIA card are identical and are located at the same position on the card, regardless of whether the card is of type II or type III).

According to another embodiment, each of the PCMCIA type II cards is provided with a connector placed along its edge, and the two PCMCIA type II cards are mounted head to tail so that the connector of the card which is not connected to said equipment can be used to connect it to the connection module.

This serves to provide mechanical strength to the assembly, without any need to provide special means for this purpose.

According to another embodiment, the connection module is constituted by a module that is in the form of a projection on one of the cards that sticks out from slot when module is in the inserted state, and that is designed to contain circuits that are too bulky to be contained in the card.

The invention thus makes it possible yet again to take advantage of existing elements to provide new functions at a lower cost.

BREIF DESCRIPTION OF THE DRAWING

Other objects and characteristics of the present invention appear on reading the following description of an embodiment, given with reference to the accompanying drawing, in which.

DETAILED DESCRIPTION OF THE PREFERRED EMBODIMENTS

Figure 1:
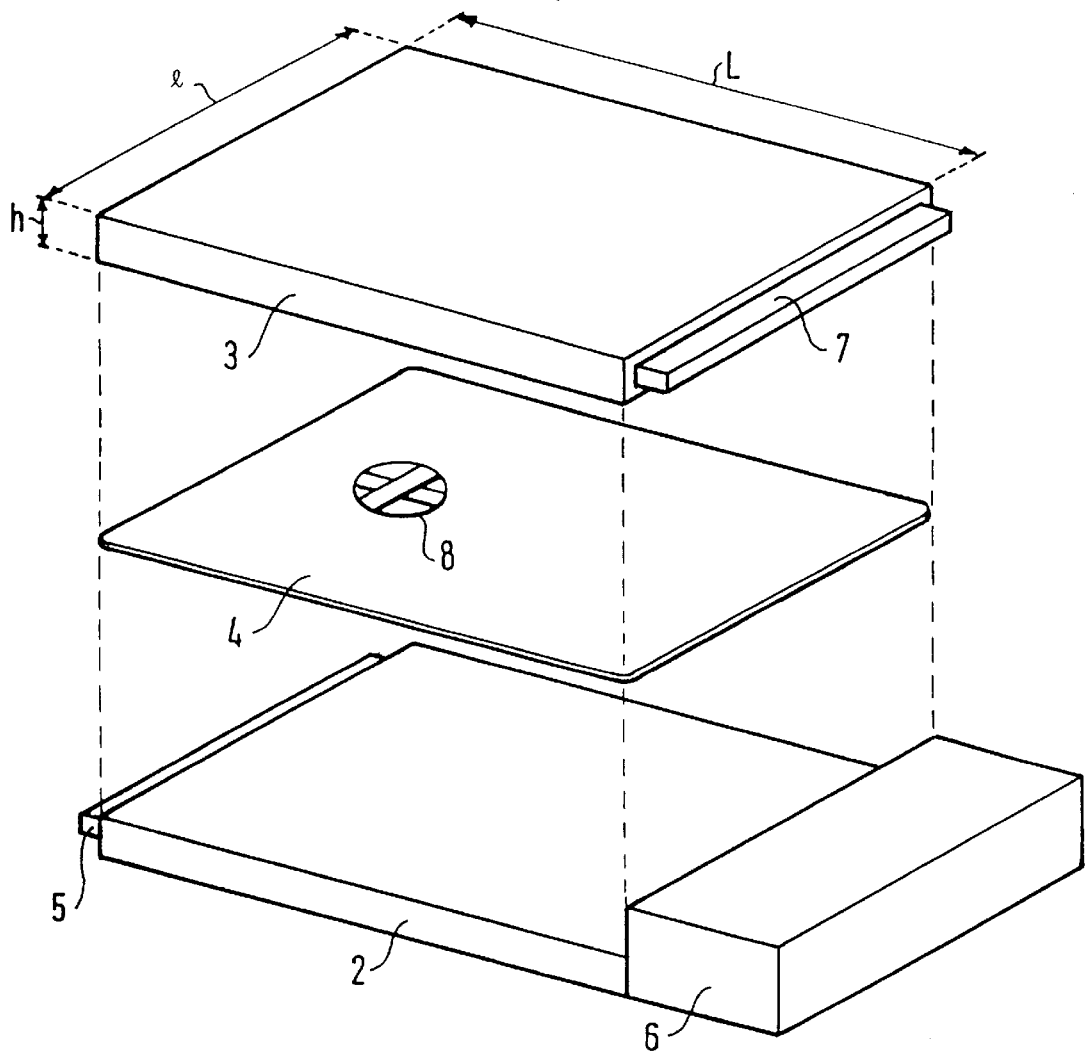
FIG. 1 is a diagram of the elements making up a modem of the invention in the non-assembled state, together with a memory card for insertion in the modem made in this way.
Figure 2:
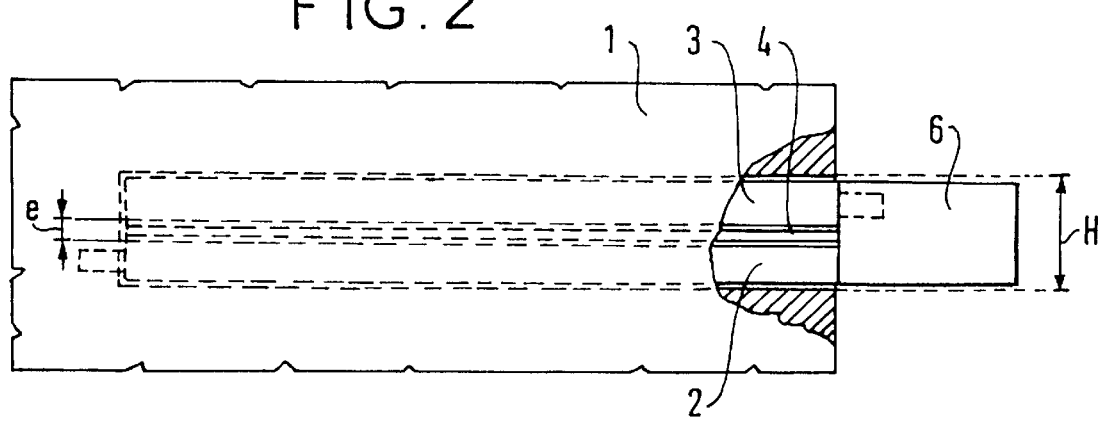
FIG. 2 is a diagram of the modem of the invention in its assembled state, and installed in the equipment to which it is fitted.
Figure 3:
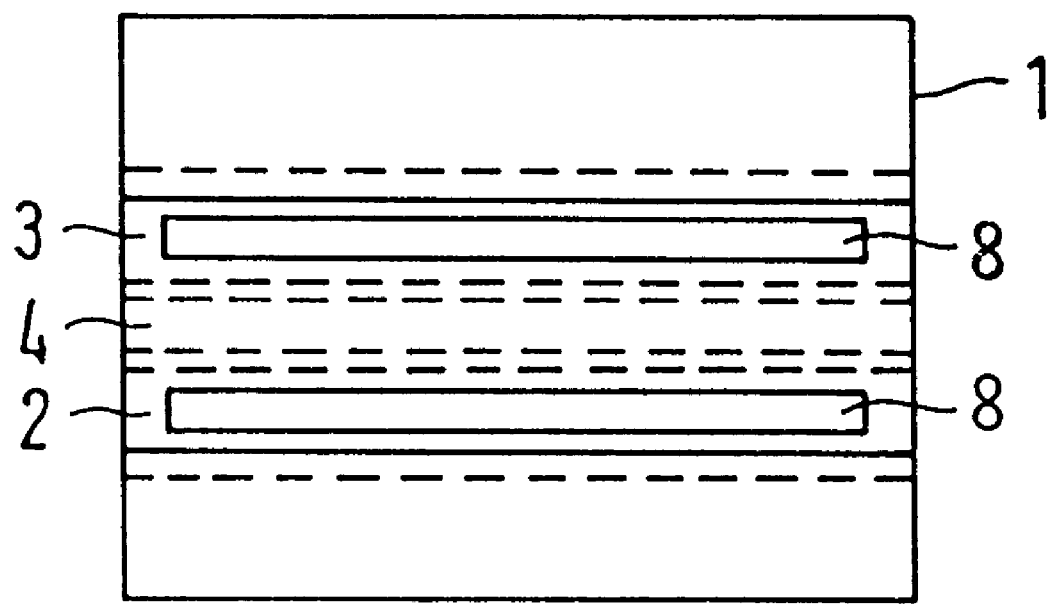
FIG. 3 is a cutaway view of the modem in its assembled state.

In the example shown in FIGS. 1 and 2, the equipment that is to be fitted with a radio modem, and referenced 1 in FIG. 2, is fitted with a slot of thickness or height H adapted to receive a radio modem presented in the form of a type III PCMCIA card, i.e. a PCMCIA card having a thickness of 10.5 mm.

In this example, the radio modem has two elements referenced 2 and 3 in FIGS. 1 and 2, each of which is made in the form of an "equipment" card, specifically in the form of a type II PCMCIA card, and thus in the form of a box of length L and of width "Z" analogous to those of a memory card 4, and each having a thickness "h" which is equal to 5 mm in this case.

Each of the housings is suitable for containing circuits 9 necessary for implementing the modem function, and is provided on its edge with a connector such as the connector 5 for the card 2, that is suitable for connecting the circuits of the card with external circuits.

In the example shown, the connector 5 is designed to be connected to a complementary connector (not shown in the assembled state of FIG. 2) that is provided in the slot.

In addition, in the example shown, one of the cards, specifically card 2, is provided with a distinct module, referenced 6, in the form of a projection that projects beyond said slot when the modem is in the inserted state, and that contains circuits which are too bulky to be housed inside the card 2, and in particular circuits that provide the radio portion of the modem function, while the frequency conversion and the baseband processing portions of the card are implemented as circuits that can be received within the card 2.

In this example, the card 3 is disposed head to tail relative to the card 2, and the connector 7 provided on the card 3 is thus used for fixing this card to the module 6 which is therefore provided in a corresponding position with a complementary connector (not visible in the assembled state as shown in FIG. 2, and not visible either in FIG. 1 because of the perspective used).

In this example, the way the circuits performing the frequency conversion and baseband processing functions are shared between the cards 2 and 3 could, a priori, be arbitrary, so communication between the cards can be necessary. Such communication thus takes place advantageously via the module 6 (which is therefore also known as the "connection" module) and via the connectors that are mutually engaged on the card 3 and in the module 6.

In the assembled state, the cards 2 and 3 are thus disposed overlying each other, with a small amount of space between them, referenced "e" in FIG. 2, which space serves to receive between the two cards a memory card such as the card 4.

By providing the assembly obtained in this way with additional means (known per se, particularly in the field of GSM telephone terminals) for performing the mechanical and the electrical functions necessary for holding the memory card and for reading the information carried thereon, a memory card reader is thus obtained.

In the example shown, a memory card is inserted into the card reader while the modem is not inserted into the equipment, and the modem fitted with the memory card is subsequently inserted into the equipment in question.

When one of the cards 2 and 3 is capable on its own of performing the modem function, the function of reading the information stored in the memory card 4 is advantageously performed by the other card.

This card performing the reading function is also advantageously the "top" card (card 3 in the example shown), i.e. the card against which the silicon chip 8 of the memory card is placed for such a card being inserted the usual way up, i.e. with its chip facing upwards.

It will be observed that numerous variants can be provided to the invention as described above.

In particular, if all of the components of the module 6 can be housed within the cards, there is no need to provide a separate module 6, and the cards 2 and 3 need not be mounted head to tail, even if that does not give such a simple manner of ensuring that the assembly has adequate mechanical strength, and even if that does not provide a relatively simple solution for obtaining optional communication between the cards 2 and 3 and for avoiding any need to modify the connection means (specifically of the connector 7) required in the equipment that is to receive said modem, compared with means suitable for a modem constituted by a type III PCMCIA card.

What is claimed is:

1. A radio modem for installation in an equipment, said modem being adapted for insertion within a slot for an equipment card of a predetermined thickness provided in said equipment, said modem comprising:

two elements containing circuits which are disposed on top of one another with a space therebetween and which are fitted within said slot so as to form a memory card reader, wherein each of said two elements is an equipment card of a predetermined thickness which is less than said predetermined thickness of said slot of said equipment.

2. A modem according to claim 1, wherein said predetermined thickness of said slot is a thickness of an equipment card of PCMCIA type III, and each of said elements is an equipment card of PCMCIA type II.

3. A modem according to claim 2, wherein only one of said PCMCIA type II cards is connected to said equipment, and wherein any connection required between said two cards for performing a modem function takes place via a third element, said third element comprising a connector module provided attached externally to one end of said two cards.

4. A modem according to claim 2, wherein each of said PCMCIA type II cards is provided with an external connector placed along its edge, and said two PCMCIA type II cards are mounted head to tail so that the connector of the card which is not connected to said equipment can be used to connect said card to said connection module.

5. A modem according to claim 3, wherein said connection module comprises a module that is in a form of a projection on one of said cards that projects from said slot when said module is in an inserted state, and said module comprises circuits that are too bulky to be contained in said card.

6. A modem according to claim 1, further comprising a memory card disposed in said space between said two elements and one of said two elements reads information stored in said memory card.

* * * * *